United States Patent
Reich et al.

(10) Patent No.: US 9,865,409 B2
(45) Date of Patent: Jan. 9, 2018

(54) SWITCH

(71) Applicant: Maschinenfabrik Reinhausen GmbH, Regensburg (DE)

(72) Inventors: Alexander Reich, Mintraching (DE); Simon Flotzinger, Aufhausen (DE); Nikolaus Unterreiner, Regensburg (DE)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 0 days.

(21) Appl. No.: 15/109,782

(22) PCT Filed: Feb. 13, 2015

(86) PCT No.: PCT/EP2015/053126
§ 371 (c)(1),
(2) Date: Jul. 6, 2016

(87) PCT Pub. No.: WO2015/124511
PCT Pub. Date: Aug. 27, 2015

(65) Prior Publication Data
US 2016/0351356 A1    Dec. 1, 2016

(30) Foreign Application Priority Data
Feb. 21, 2014  (DE) .................. 10 2014 102 262

(51) Int. Cl.
*H01H 9/52* (2006.01)
*H01H 9/00* (2006.01)
(Continued)

(52) U.S. Cl.
CPC ............... *H01H 9/52* (2013.01); *H01F 29/04* (2013.01); *H01H 9/0044* (2013.01); *H01L 23/473* (2013.01)

(58) Field of Classification Search
CPC ......... H01L 2924/00; H01L 2924/0002; H01L 2224/48091; H01L 23/473; H01L 35/30;
(Continued)

(56) References Cited

U.S. PATENT DOCUMENTS

| 4,051,509 A | 9/1977 | Beriger |
| 5,544,035 A * | 8/1996 | Beriger ................. H02M 7/003 363/132 |

(Continued)

FOREIGN PATENT DOCUMENTS

| DE | 695679 U | 8/1940 |
| DE | 2051151 A | 4/1972 |
| DE | 2303550 A | 8/1974 |

*Primary Examiner* — Adam B Dravininkas
(74) *Attorney, Agent, or Firm* — Andrew Wilford (57) ABSTRACT

An on-load tap changer has a housing, a switching module inside the housing and having a switch and a cooling conduit, an insulating liquid that surrounds the switching module inside the housing, and a cooling circuit comprising a pump, the cooling conduit and a heat exchanger. The interior of the housing and the cooling circuit are hydraulically connected together for flow of the insulating liquid through the cooling circuit and the housing and cooling of the housing with the insulating liquid.

9 Claims, 6 Drawing Sheets

(51) Int. Cl.
*H01F 29/04* (2006.01)
*H01L 23/473* (2006.01)

(58) Field of Classification Search
CPC ... H01F 29/04; H01F 27/10; H01F 6/04; H01H 9/52; H01H 9/0044
See application file for complete search history.

(56) References Cited

U.S. PATENT DOCUMENTS

| | | | | |
|---|---|---|---|---|
| 5,606,201 | A * | 2/1997 | Lutz | F28F 13/02 |
| | | | | 257/714 |
| 5,923,533 | A * | 7/1999 | Olson | H01L 23/473 |
| | | | | 165/80.4 |
| 6,140,699 | A | 10/2000 | Hildbrand | |
| 6,354,086 | B1 * | 3/2002 | Inoue | H01L 35/30 |
| | | | | 417/420 |
| 6,601,641 | B1 * | 8/2003 | Stefanik | H01L 23/473 |
| | | | | 165/104.28 |
| 8,926,592 | B2 * | 1/2015 | Blott | 600/29 |
| 2004/0025516 | A1 * | 2/2004 | Van Winkle | B60H 1/00478 |
| | | | | 62/3.3 |
| 2006/0241333 | A1 * | 10/2006 | Hunter | A61N 1/40 |
| | | | | 600/13 |
| 2015/0249892 | A1 * | 9/2015 | Kuhnel | H04R 25/552 |
| | | | | 381/315 |

* cited by examiner

SWITCH

CROSS REFERENCE TO RELATED APPLICATIONS

This application is the US-national stage of PCT application PCT/EP2015/053126 filed 13 Feb. 2015 and claiming the priority of German patent application 102014102262.9 itself filed 21 Feb. 2014.

FIELD OF THE INVENTION

The invention relates to a switch assembly with a switching module and a cooling conduit.

OBJECT OF THE INVENTION

The object of the invention is to provide a switch assembly with a switching module in which the cooling is designed to be simple, economic and maintenance-friendly.

SUMMARY OF THE INVENTION

This object is fulfilled by a switch assembly according to the invention comprising:
a housing
at least one switching module inside the housing and comprises at least one switch and at least one cooling conduit;
an insulating liquid that surrounds the switching module, inside the housing, and
a cooling circuit comprising a pump, the cooling conduits and a heat exchanger;
wherein:
the interior of the housing and the cooling circuit are hydraulically connected together.

A hydraulic connection between the cooling circuit and the interior of the housing in which the at least one switching module is arranged makes it possible to use the same insulating liquid for cooling the switches and for insulating the switching modules. Possible leakages in the cooling conduit have a less bad effect, due to the use of one of the same insulating liquid, on the switch assembly than, for example, in the case of different insulating liquids and cooling liquids, for example water. Mixing of the different liquids, for example water and oil, can have disastrous consequences. In addition, maintenance is as a result substantially simplified. It is here merely necessary to change one insulating liquid, instead of two. Compensation for small leakages in the cooling conduit is provided by the hydraulic connection so that immediate maintenance and thus shutdown of the switch assembly are not necessary.

The switch assembly can be constructed in any desired mode and manner, for example as a tap changer for tapped transformers in the low-voltage, medium-voltage and high-voltage field and as tap changers for tapped transformers in energy mains or smelting furnace applications.

The switching module of the switch assembly can be constructed in any desired mode and manner and can consist of, for example, semiconductor wafer cells, particularly thyristors IGBTs, etc.

The insulating liquid can be formed in any desired mode and manner, for example as insulating oil or ester liquid.

The switch assembly can include any desired number of switching modules, preferably one switching module for each phase of a tapped transformer to be switched.

The connection between the interior of the housing and the cooling circuit can be formed in any desired mode or manner; for example this can be arranged in the expansion tank outside the switch assembly.

It can be provided that
the switching module comprises at least one cooling box in which the cooling conduits associated therewith are formed;
each cooling box has an inlet for introducing and an outlet for discharging the insulating liquid; and
each cooling box and the associated switch are thermally, electrically and mechanically connected together.

The cooling boxes are constructed from an electrically as well as thermally conductive material such as, for example, aluminum. The cooling conduits pass through the interior of the cooling boxes in, for example, meander form.

It can be provided that
each switching module comprises at least one switching module column; and
each switching module column comprises at least one cooling box and at least one switch, arranged one above the other and thermally, mechanically and electrically conductively connected together.

The switches can be constructed in any desired mode and manner and, for example, electrically connected individually or in groups. In the groups, the switches are electrically connected in series or in parallel. The switching module can contain any desired number of switching module columns.

It can be provided that each switching module column is between an upper clamping plate and a lower clamping plate.

It can be provided that
each upper clamping plate and the associated lower clamping plate are mechanically connected together by tie rods;
the tie rods are of hollow construction;
an upper distributor plate is above the upper clamping plate and is mechanically connected therewith;
a lower distributor plate is below the lower clamping plate and is mechanically therewith;
the tie rods are hydraulically connected with the cooling conduits;
the lower distributor plate and at least one of the tie rods serve as a forward run in order to introduce the insulating liquid therethrough into the cooling conduit; and
the upper distributor plate and at least one of the other tie rods serve as a return run in order to discharge the insulating liquid therethrough from the cooling conduits.

The hydraulic connection between the tie rods and the cooling conduits can be formed by at least one cooling box connected with a tie rod by lines. The cooling conduit can be formed, for example, by cooling boxes hydraulically connected in parallel or in series.

The tie rods and the distributor plates can be constructed in any desired mode and manner, for example from a high-strength electrically insulating material such as glass fiber-reinforced plastic.

It can be provided that the interior of the housing and the cooling circuit are connected together by an expansion tank.

It can be provided that
the switching module comprises four switching module columns; and
in each switching module column at least one of the tie rods is provided as a forward run and at least one of the other tie rods is provided as a return run.

It can be provided that
the switching module columns are held in the switching module by a pressure distributor.

It can be provided that
the switch assembly is a tap changer for voltage regulation at a tapped transformer with a control winding.

BRIEF DESCRIPTION OF THE DRAWING

The invention and the advantages thereof are described in more detail with reference to the accompanying drawings, in which.

Identical reference numerals are used for the same or equivalent elements of the invention. Moreover, for the sake of clarity only reference numerals are illustrated in the individual figures that are required for description of the respective figure. The illustrated forms of embodiment merely represent examples of how the switch assembly according to the invention can be and thus do not represent a definitive limitation of the invention.

SPECIFIC DESCRIPTION OF THE INVENTION

Figure 1:
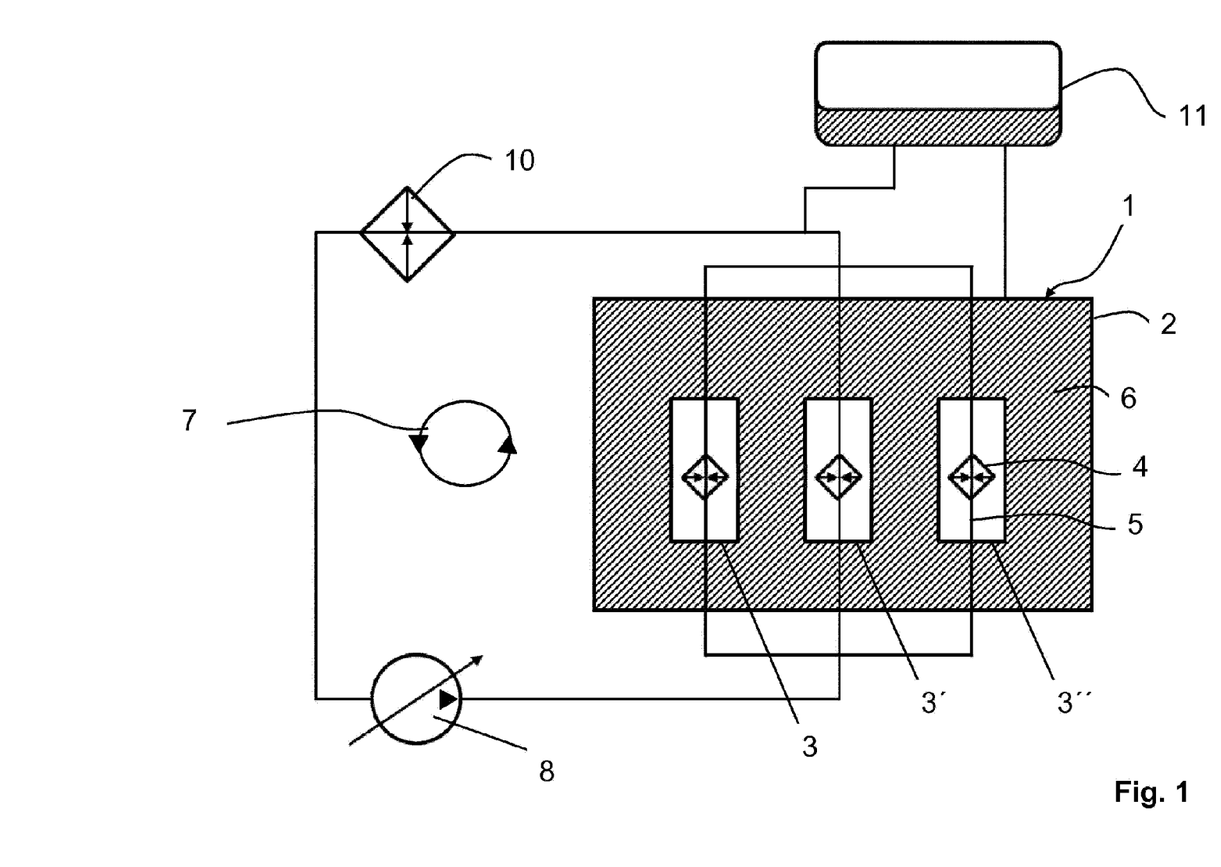
FIG. 1 shows a switch assembly with a cooling circuit.

FIG. 1 shows a switch assembly 1, particularly an on-load tap changer for voltage regulation at a control transformer with a control winding, with a cooling circuit 7. The switch assembly 1 comprises a housing 2 filled with an insulating liquid 6. Three switching modules 3, 3', 3" are inside the housing 2. Each switching module 3, 3', 3" comprises at least one switch 4 and at least one cooling conduit 5. Each cooling conduit 5 is a part of the cooling circuit 7. In addition, a heat exchanger 10 and a pump 8 are in the cooling circuit 7. The interior of the housing 2 and the cooling circuit 7 are hydraulically connected together, i.e. an exchange of insulating liquid 6 between the cooling circuit 7 and the interior of the housing 2 is possible. In the form of embodiment illustrated here the connection between the interior of the housing 2 and the cooling circuit 7 is realized by an expansion tank 11. The insulating liquid 6 is preferably formed as an ester or insulating oil that can be used not only in the cooling circuit 7 for cooling each switching module 3, 3', 3", but also inside the housing 2 as insulating medium. The switch 4 is a semiconductor wafer cell and can be constructed as, for example, a thyristor, an IGBT, etc.

Figure 2:
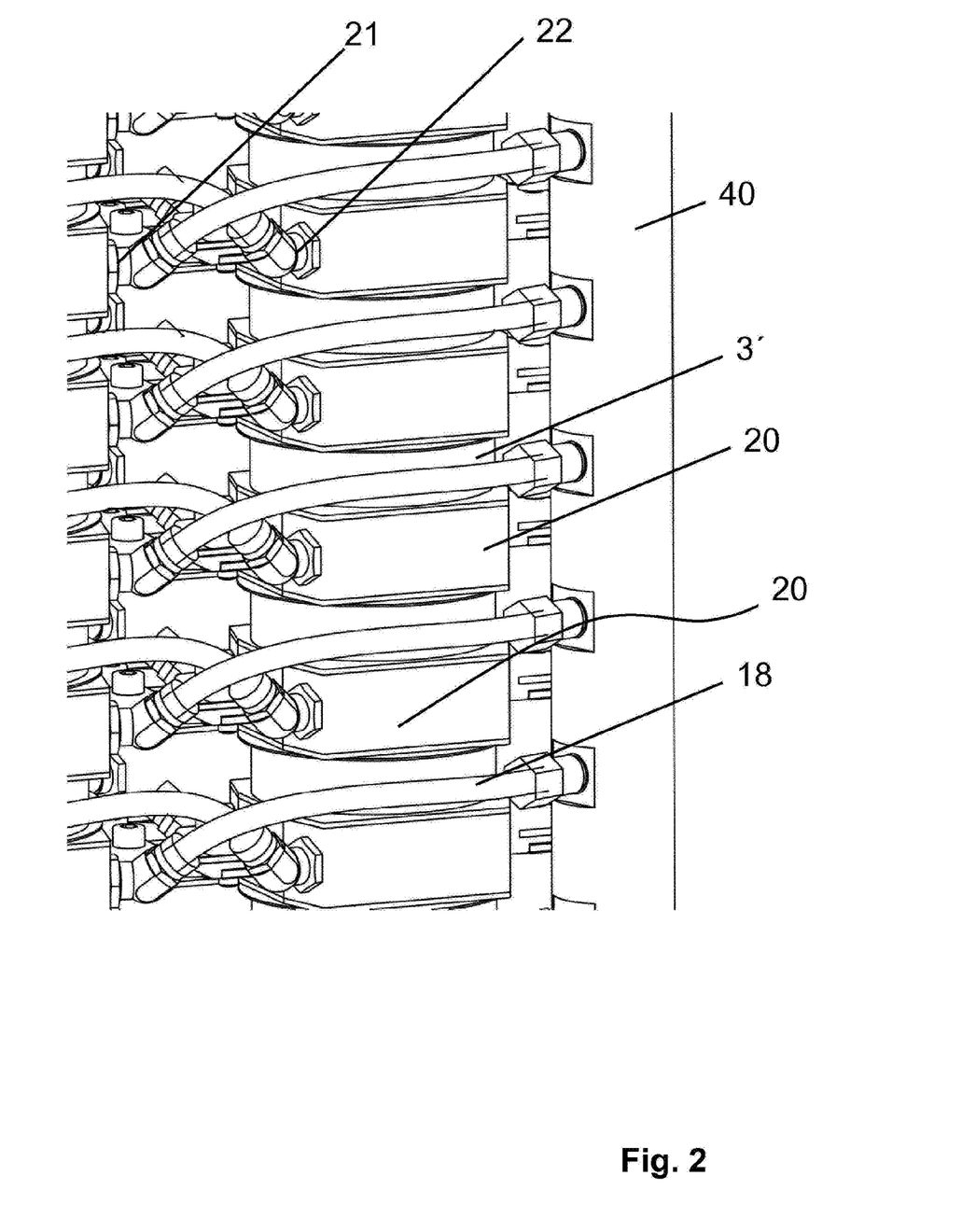
FIG. 2 shows a detail of a switching module.

FIG. 2 shows a detail of a switching module 3, particularly a plurality of switches 4 and cooling boxes 20 that are mechanically, thermally and electrically connected together in alternation. The cooling conduit 5, through which the insulating liquid 6 is conveyed for cooling the switch 4, is formed inside each cooling box 20. The cooling boxes 20 each have for that purpose a respective inlet 21 for introduction of the insulating liquid 6 and an outlet 22 for discharge of the insulating liquid 6.

The switches 4 can be electrically connected individually or in groups. In the groups, the switches 4 are connected in series or in parallel.

Figure 3:
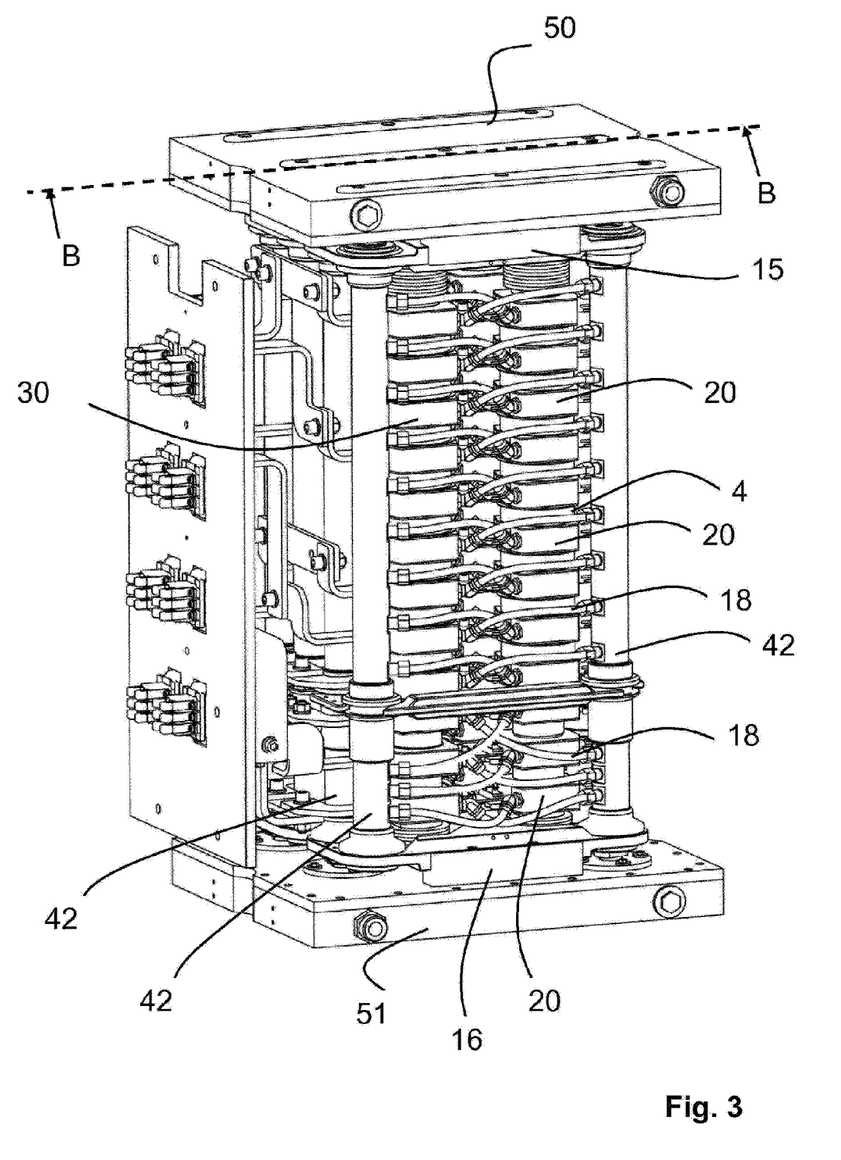
FIG. 3 shows a switching module.

FIG. 3 shows the entire switching module 3. This comprises four switching module columns 30 that are each constructed from a plurality of switches 4 and cooling boxes 20 with cooling conduits 5 formed therein, the elements and boxes being stacked one above the other and mechanically, thermally and electrically connected. The cooling conduits 5 of the individual cooling boxes 20 are hydraulically interconnected by lines 18. The switching module columns 30 are between an upper clamping plate 15 and a lower clamping plate 16. In addition, eight tie rods 42 are positioned between the clamping plates 15, 16. These tie rods 42 are mechanically connected with the clamping plates 15, 16 and form the frame of the switching module 3. The tie rods 42 are preferably constructed from glass fiber-reinforced plastics material tubes and are thus internally hollow and electrically insulating. The tie rods 42 are in addition connected with the cooling boxes 20 by lines 18. The cooling boxes 20 are hydraulically connected together in series or in parallel.

An upper distributor plate 50 is above the upper clamping plate 15 and a lower distributor plate 51 is below the lower clamping plate 16. The upper distributor plate 50, which serves as a return run 61, has, in the interior, channels that on the one hand are hydraulically connected with the tie rods 42 and on the other hand with the heat exchanger 10 or the pump 8 of the circuit 7. In addition, the lower distributor plate 51 serving as forward run 61 has, in the interior, channels that are connected on the one hand with the tie rods 42 and on the other hand with the heat exchanger 10 or the pump 8 of the circuit 7. The lower distributor plate 51 additionally serves for mounting the switching module 3. Since the two distributor plates 50, 51 consist of plastics material, these at the same time serve for insulation of the switching module 3 relative to the potential at the housing 2.

Figure 4:
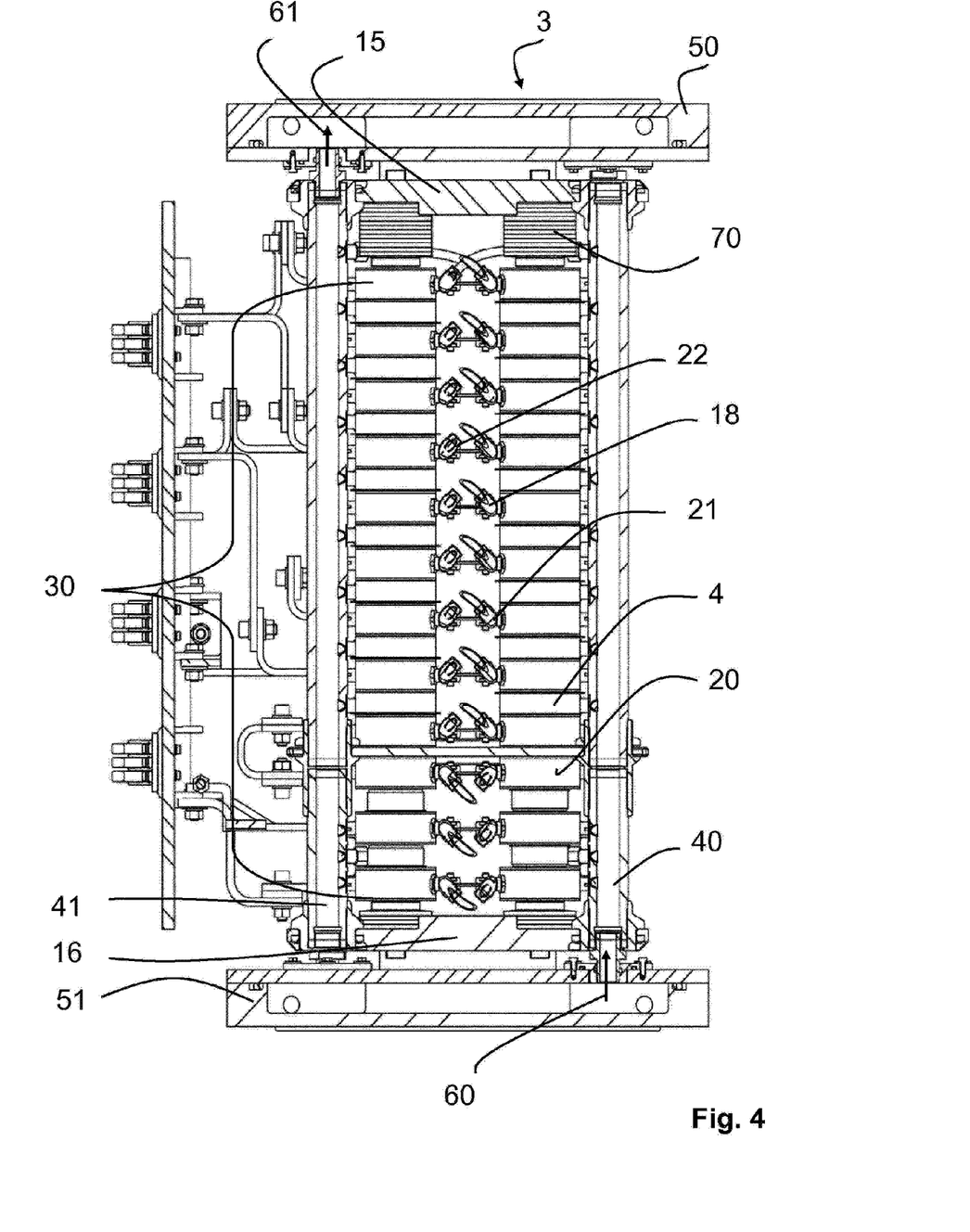
FIG. 4 shows a switching module in the section B-B.

FIG. 4 shows a sectional view B-B of the switching module 3 of FIG. 3. In that, a first tie rod 40 is mechanically and hydraulically connected with the lower clamping plate 16. In addition, the first tie rod 40 is hydraulically connected by a plurality of lines 18 with the cooling conduits 5 formed in the cooling boxes 20. The second tie rod 41 is mechanically and hydraulically connected with the upper clamping plate 15. In addition, the second tie rod 41 is similarly mechanically and hydraulically connected by a plurality of lines 18 with the cooling conduits 5 formed in the cooling boxes 20. Thus, the entire switching module 3 can be regarded as a cooling conduit 5. The cooling boxes 20 can in that case be hydraulically connected with one another in parallel or in series between two tie rods 40, 41.

Figure 5:
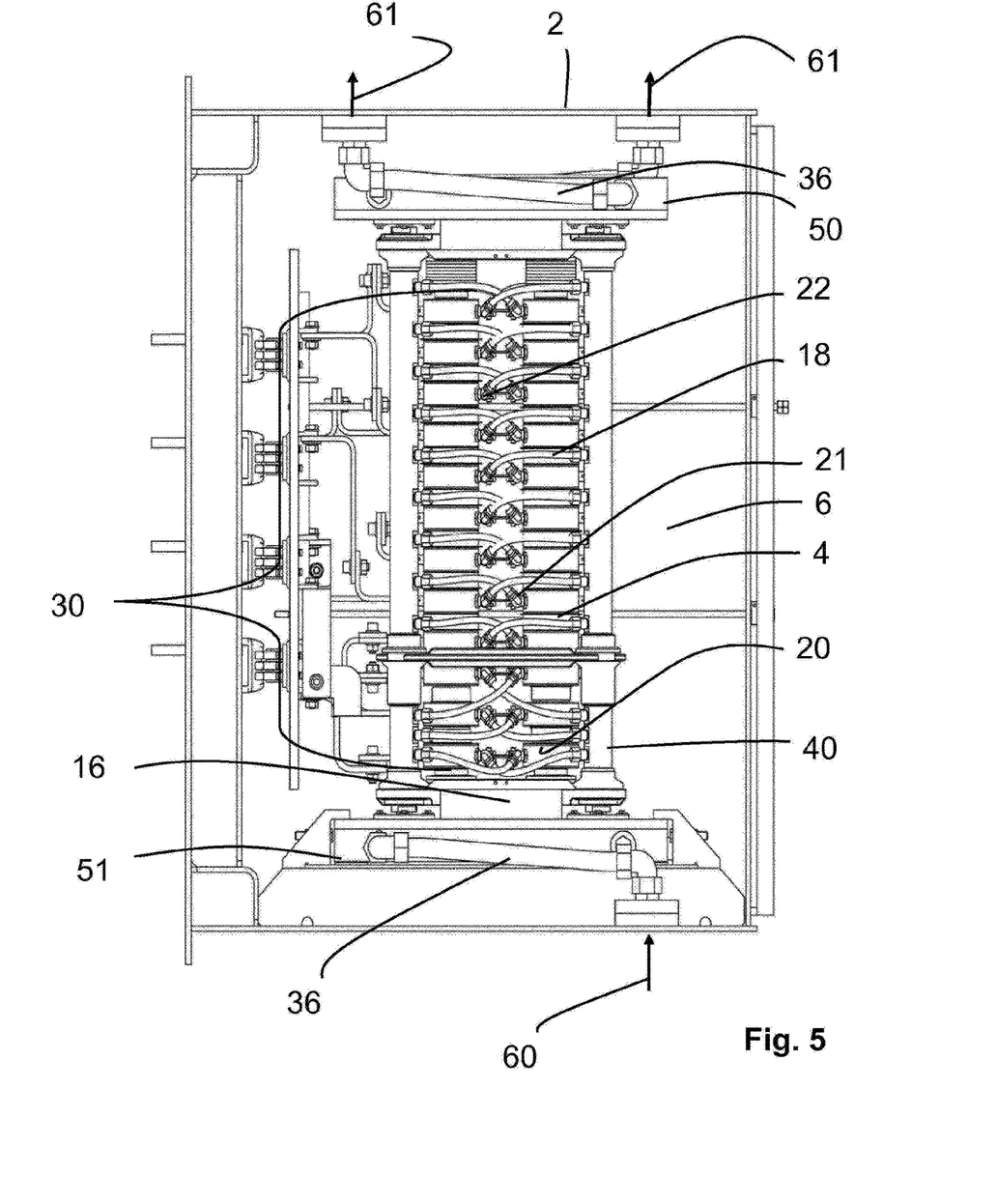
FIG. 5 shows a switching module in a housing.

FIG. 5 shows a switching module 3 in the housing 2 of the switch assembly 1. Here, the return run 61 and the forward run 60, particularly the upper and lower distributor plates 50, 51, are connected by pipe lines 36 with the pump 8 outside the housing 2, and the heat exchanger 10. The switching module 3 is here surrounded by the insulating liquid 6.

Figure 6:
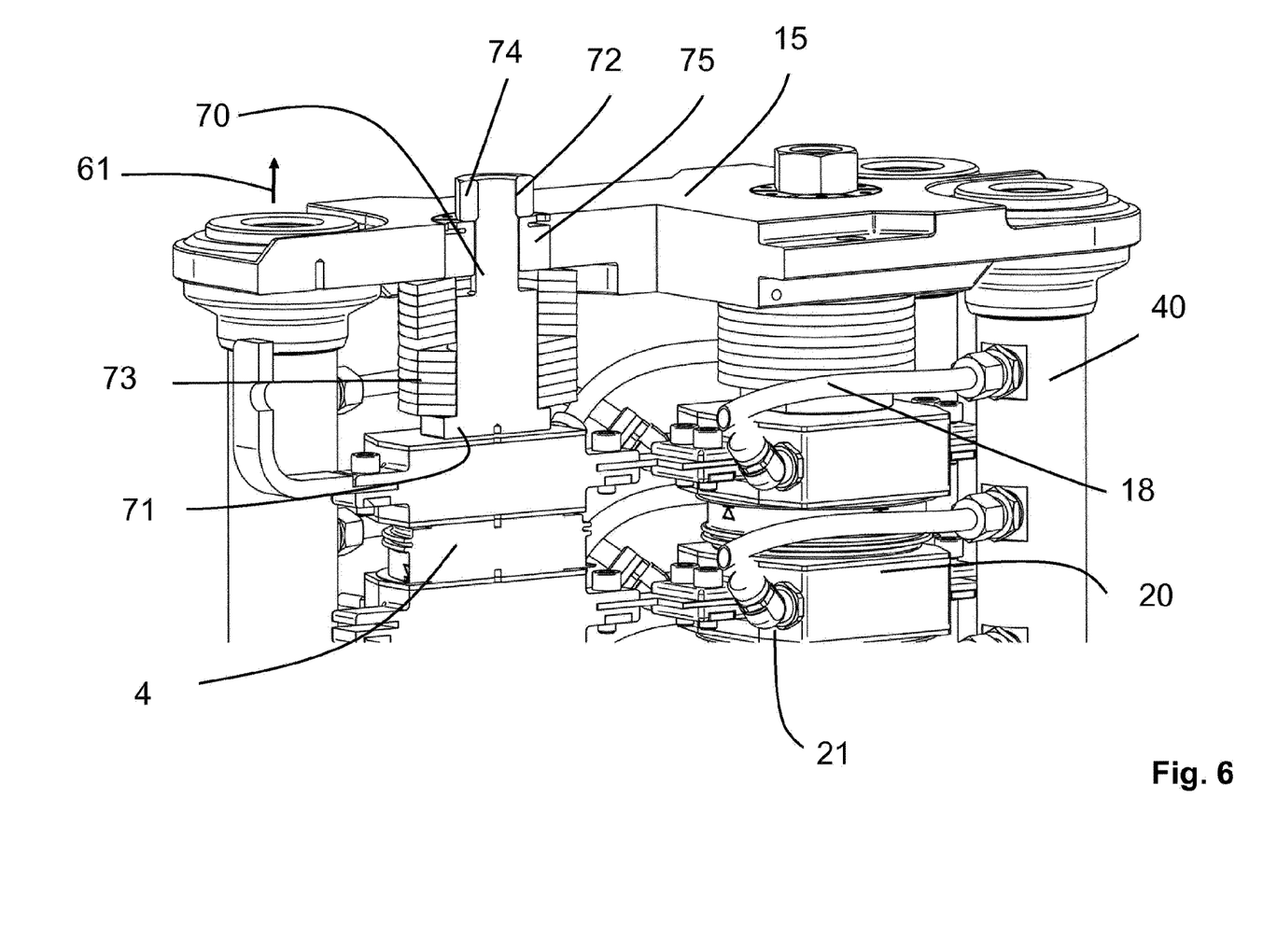
FIG. 6 shows a pressure distributor of a switching module.

FIG. 6 shows a detailed view of the switching module 3. In order for the switching module columns 30 to be able to be fixed in the switching module column 3 a pressure distributor 70 is mounted between the uppermost cooling box 20 and the upper clamping plate 15. The pressure disturbing unit 70 has a flange 71 in the region arranged at the cooling box 20. The upper region of the pressure distributor 70 has a thread 72, at the upper end of which a screw nut 74 is arranged. Plate springs 73 and a plate-spring support 75 are between the flange 71 and the screw nut 74. The pressure distributor 70 is set beforehand under a press to a defined biasing force required for the switching module 3. The plate springs 73 are urged, during the bracing, by the plate-spring support 75 against the flange 71 and are locked by the screw nut 74. The pressure distributor 70 is screwed by the plate-spring support 75 into the clamping plate 15 until the pressure distributor 70 bears against the uppermost cooling box 20 of the respective switching module column 30. The pressure distributor 70 is subsequently locked and secured against turning. Through releasing the screw nut 74, the defined bias of the plate springs 73 is transmitted to the switching module column 30.

Since each switching module column 30 is braced by a separate pressure distributor 70 the two switching module columns 30 are mechanically decoupled from one another and compensation can thus be provided for differences in height.

The invention claimed is:

1. A switch assembly comprising:
a housing;
a switching module inside the housing and having a switch and a cooling conduit;
an insulating liquid that surrounds the switching module inside the housing; and
a cooling circuit comprising a pump, the cooling conduit and a heat exchanger, the interior of the housing and the cooling circuit being hydraulically connected together for flow of the insulating liquid through the cooling circuit and the housing and cooling of the housing with the insulating liquid.

2. The switch assembly according to claim 1, wherein
the switching module comprises a cooling box in which the cooling conduit is formed; and
the cooling box and the switch are thermally conductively connected together.

3. The switch assembly according to claim 1, further comprising:
an expansion tank connecting together the interior of the housing and the cooling circuit.

4. The switch assembly according to claim 1, wherein
the switch assembly is an on-load tap changer for voltage regulation at a tapped transformer with a control winding.

5. A switch assembly comprising:
a housing;
a switching module inside the housing and having a switch, a cooling conduit, and a switching module column having a cooling box and a switch that are one above the other and thermally conductively connected together;
an insulating liquid that surrounds the switching module inside the housing; and
a cooling circuit comprising a pump, the cooling conduit and a heat exchanger, the interior of the housing and the cooling circuit being hydraulically connected together.

6. The switch assembly according to claim 5, further comprising:
a pressure module holding the switching module column in the switching module.

7. A switch assembly comprising:
a housing;
a switching module inside the housing and having a switch and a cooling conduit;
an insulating liquid that surrounds the switching module inside the housing;
a cooling circuit comprising a pump, the cooling conduit and a heat exchanger, the interior of the housing and the cooling circuit being hydraulically connected together;
an upper clamping plate and a lower clamping plate between which the switching module is held;
tubular tie rods mechanically interconnecting the upper clamping plate and the lower clamping plate;
an upper distributor plate above the upper clamping plate and mechanically connected therewith; and
a lower distributor plate below the lower clamping plate and mechanically connected therewith, the tie rods being hydraulically connected with the cooling conduits, the lower distributor plate and one of the tie rods serving as a forward run in order to conduct the insulating liquid therethrough into the cooling conduits and the upper distributor plate and one of the other tie rods serving as a return run in order to conduct the insulating liquid therethrough out of the cooling conduits.

8. The switch assembly according to claim 7, wherein
the switching module comprises four of the switching module columns; and
in each of the switching module columns one of the tie rods is provided as a forward run and another one of the tie rods is provided as a return run for the insulating liquid.

9. An on-load tap changer for voltage regulation at a tapped transformer with a control winding, the tap changer comprising:
a housing;
a switching module inside the housing and having a switch and a cooling conduit;
an insulating liquid that surrounds the switching module inside the housing; and
a cooling circuit comprising a pump, the cooling conduit and a heat exchanger, the interior of the housing and the cooling circuit being hydraulically connected together.

* * * * *